United States Patent
Skofljanec

(10) Patent No.: US 6,788,539 B2
(45) Date of Patent: Sep. 7, 2004

(54) ELECTRONIC CONTROL DEVICE FOR USE IN VEHICLES

(75) Inventor: Robert Skofljanec, Moos-Bankholzen (DE)

(73) Assignee: TRW Automoitve Electronics & Components GmbH & Co. KG, Radolfzell (DE)

(*) Notice: Subject to any disclaimer, the term of this patent is extended or adjusted under 35 U.S.C. 154(b) by 0 days.

(21) Appl. No.: 10/207,353

(22) Filed: Jul. 29, 2002

(65) Prior Publication Data

US 2003/0048611 A1 Mar. 13, 2003

(30) Foreign Application Priority Data

Jul. 31, 2001 (DE) .................................. 201 12 594 U

(51) Int. Cl.⁷ .................................................. H05K 7/20
(52) U.S. Cl. .................... 361/719; 361/704; 174/252; 165/80.2; 165/185
(58) Field of Search ............................... 361/683, 685, 361/687–690, 702–704, 719, 720, 725, 727, 741, 756, 802; 174/16.3, 252; 211/41.17; 312/223.1, 223.2

(56) References Cited

U.S. PATENT DOCUMENTS 5,019,948 A * 5/1991 Steketee et al. ............ 361/802
5,590,026 A * 12/1996 Warren et al. .............. 361/704
5,599,080 A * 2/1997 Ho ........................... 312/334.7
5,742,478 A * 4/1998 Wu ............................ 361/704
5,838,538 A * 11/1998 Yee ............................ 361/683
6,243,270 B1 * 6/2001 Yee ............................ 361/756
6,377,445 B1 * 4/2002 Davis et al. ................ 361/683
6,493,233 B1 * 12/2002 De Lorenzo et al. ....... 361/752

FOREIGN PATENT DOCUMENTS

| DE | 1847846 U | 3/1962 |
| DE | 4242944 A1 | 6/1994 |
| DE | 19700558 C1 | 6/1998 |
| DE | 19709243 C1 | 6/1998 |
| DE | 29801997 U1 | 8/1998 |
| DE | 19911990 A1 | 9/2000 |
| DE | 19924344 A1 | 12/2000 |
| DE | 20004263 U1 | 2/2001 |

* cited by examiner

Primary Examiner—Boris Chervinsky
(74) Attorney, Agent, or Firm—Tarolli, Sundheim, Covell & Tummino L.L.P.

(57) ABSTRACT

An electronic control device for use in a vehicle has a metallic housing (10) to accommodate electronic components of the device Plural shaped guide elements (14) are formed on the inside of the housing (10) Fastening members (24) for an electronic component (26) can be engaged in a form-fitting manner into elongate channels defined by the rail-shaped guide elements (14).

14 Claims, 4 Drawing Sheets

ELECTRONIC CONTROL DEVICE FOR USE IN VEHICLES

FIELD OF THE INVENTION

The present invention relates to an electronic control device for use in vehicles, which has a metallic housing to accommodate electronic components of the control device

BACKGROUND OF THE INVENTION

The electronic components accommodated in the metallic housing of such an electronic control device serve, for example, to control occupant restraint systems connected to the control device, such as belt tensioners and airbags In order for the device to function reliably and dependably, it is important for the electronic components to be firmly connected to the housing body However, it is also desirable to have the fastest and simplest possible assembly of the electronic components as well as a housing body that can be used for various electronic components Known housings for such control devices have guide grooves on their side walls in which a printed circuit board can be slid into the housing. In the inserted position, the printed circuit board is additionally supported by guide elements formed on the rear of the housing. Since the guide elements are attached to the side and rear, it is necessary for the printed circuit board to occupy the entire length and width of the housing.

SUMMARY OF THE INVENTION

The invention provides a control device whose electronic components are reliably and rigidly connected to the housing body and whose housing body can be used to accommodate electronic components of various sizes According to the invention, the metallic housing has a wall with a at least one internal rail wherein an elongate channel is formed that widens internally A fastening, member has a head portion inserted and retained in the channel and a pin portion connected to one of the electronic components Due to the interaction of the internal rail with the fastening member, the electronic component is securely and reliably attached to the housing Therefore, it is possible to dispense with a rear guide element so that, for example, the same housing can be used, irrespective of the size of the printed circuit board and of the electronic modules situated on it.

According to preferred embodiment, the housing is provided with external integrally shaped cooling ribs A power semiconductor located on a printed circuit board is attached via the fastening member to the housing in thermal contact therewith. Thanks to the large cooling surface area of the housing, the heat generated by the power semiconductor can be dissipated into the environment

BRIEF DESCRIPTION OF THE DRAWINGS

Additional features and characteristics ensue from the description below of several embodiments and from the drawings to which reference is made In the drawings.

DESCRIPTION OF THE PREFERRED EMBODIMENTS

Figure 1:
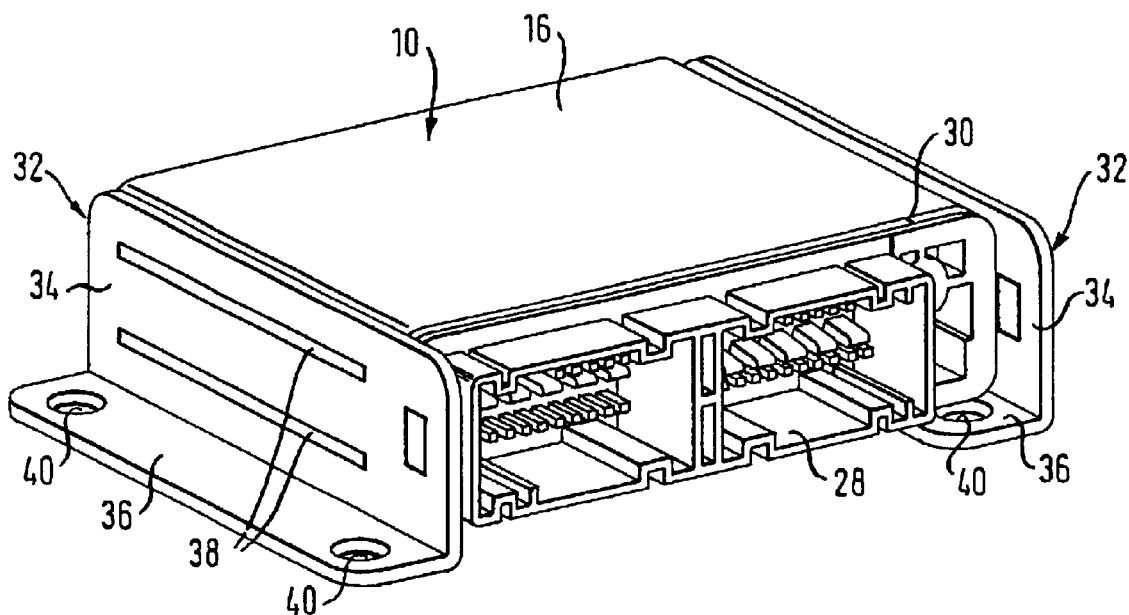
FIG. 1 is a perspective view of a control device according to the invention with a metallic housing on whose side walls mounting brackets are attached.
Figure 2:
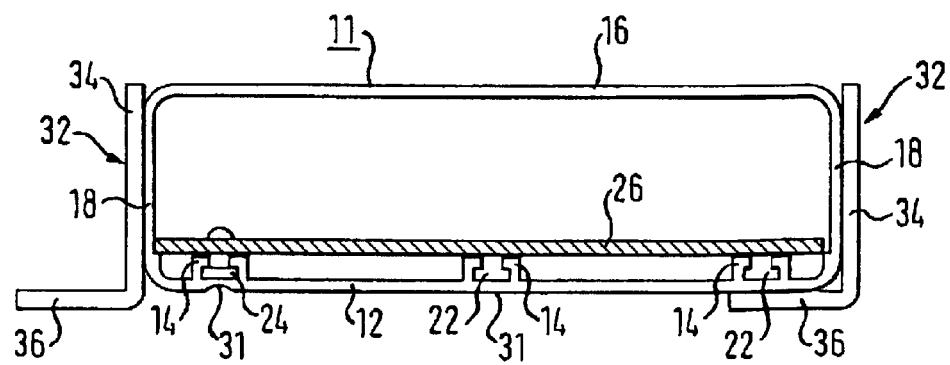
FIG. 2 is a schematic side view of the control device according to the invention of FIG. 1, FIGS. 3a and 3b are schematic top views of two different variants of the arrangement of the mounting brackets to a plug collar attached to a side wall of the control device.

The control device shown in FIGS. 1 and 2 has a housing 10 with a housing body 11, on the inside of whose bottom wall 12 there are three parallel rail-shaped guide elements 14 that extend across the entire length of the bottom wall 12 The housing body 11 also has a cover wall 16 and two side walls 18 The housing body 11 is preferably made of aluminum in one piece by means of impact extrusion. The rail-shaped guide elements 14 each form an internally widening channel 22. A metallic fastening member 24 has a head portion inserted into the channel 22. The head portion of fastening member 24 is shaped in such a way that it engages in a form-fitting manner with the internally widened channel 22 of the rail-shaped guide element 14 At its upper end relative to FIG. 2, the fastening element 24 has a pin portion attached to a printed circuit board 26. The fastening member 24 can be, for example, a pin or a stud that is pressed onto an opening formed in the printed circuit board 26

In order to mount the printed circuit board 26 in the housing body 11, the head portion of the fastening member 24 is first attached to the printed circuit board 26. Then the printed circuit board 26, at whose one end a plug socket 28 is attached (also see FIG. 1), is inserted into the housing body 11, namely, in such a way that the lower end of the fastening member 24 relative to FIG. 2 engages with the internally widened channel 22 of the rail-shaped guide element 14 and is slid along this channel. Since the fastening member 24 and the channel 22 interengage in a form-fitting manner, the printed circuit board can only be slid along the guide rails but no longer in the two directions perpendicular to that. The printed circuit board 26 is completely inserted in the housing and secured in place when the plug socket 28 is latched at the front end 30 of the housing body 11

In order to fully block the fastening member 24 with the printed circuit board 26 in the channel 22, the housing body 11 is locally deformed from the outside in the area 31 of the bottom wall 12, which is located below the fastening member 24. At the same time, this creates an electrically conductive connection between the printed circuit board 26 and the housing body 11 via the fastening member 24

Via the fastening member, which is blocked in the channel of the rail-shaped guide element, the printed circuit board is reliably and rigidly connected to the housing body Since the fastening member can be fastened anywhere on the printed circuit board, the same housing can be used to accommodate printed circuit boards of differing sizes.

In order to attach the housing 10 to the car body, each of the side walls 18 of the housing body 11 has a mounting bracket 32 with a first bracket leg 34 and a second bracket leg 36 arranged perpendicular to the first one In order to fasten the mounting bracket 32 to the side walls 18, according to the embodiment shown in FIGS. 1 and 2, there are two rib-like projections 38 formed onto a side wall 18 of the housing body 11. These rib-like projections 38 can each be inserted and pressed into slits that are formed on the first bracket leg 34 of the mounting bracket 32 and that are complementary to the rib-like projections. The second bracket legs 36 of the mounting bracket 32 are each provided with openings 40 through which the housing 10 can be fastened, for example, screwed to the car body.

The mounting brackets—like the left-hand mounting bracket 32 relative to FIG. 1—can be arranged with respect to the housing 10 in such a way that the second bracket leg 36, in which the openings 40 are formed, runs parallel to the bottom and top walls of the housing and projects towards the outside relative to the housing 10. The mounting brackets, however, can also be arranged like the right-hand mounting bracket 32 relative to FIG. 1 in such a way that the second bracket leg 36 extends at least partially below the bottom wall of the housing body 11. The opening or the openings 40 are then in the vicinity of the bracket leg 36, which is not situated below the bottom wall 12 of the housing 10, but rather protrudes laterally.

Figure 3A:
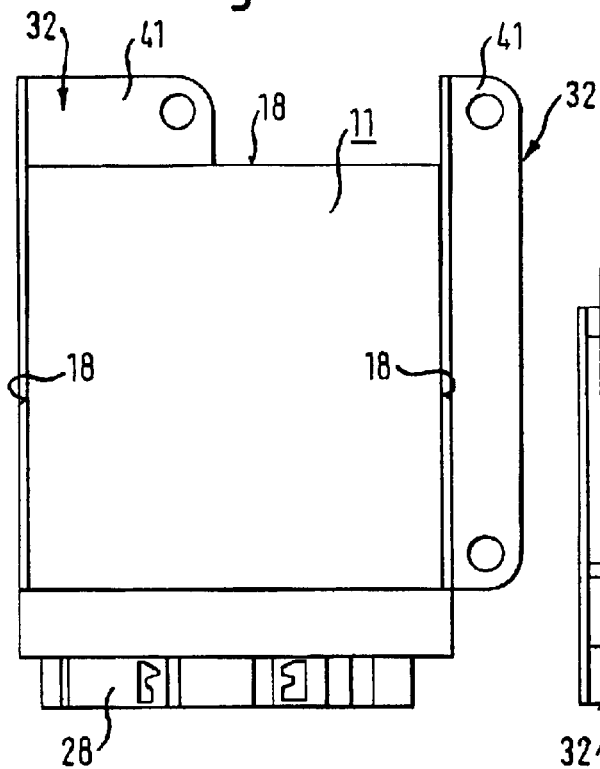
Figure 3B:
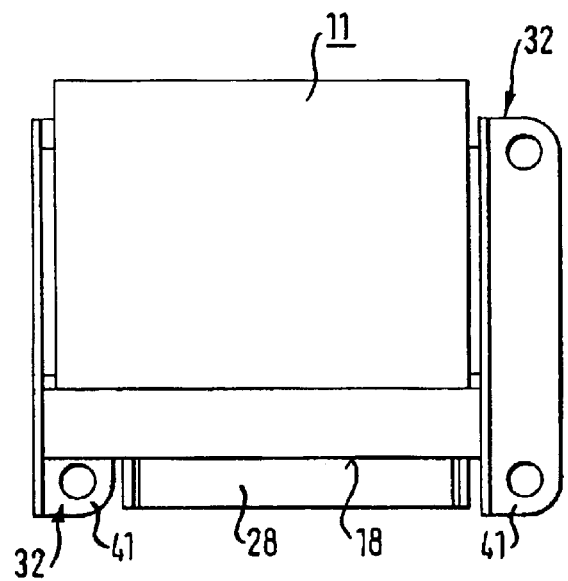
Figure 4:
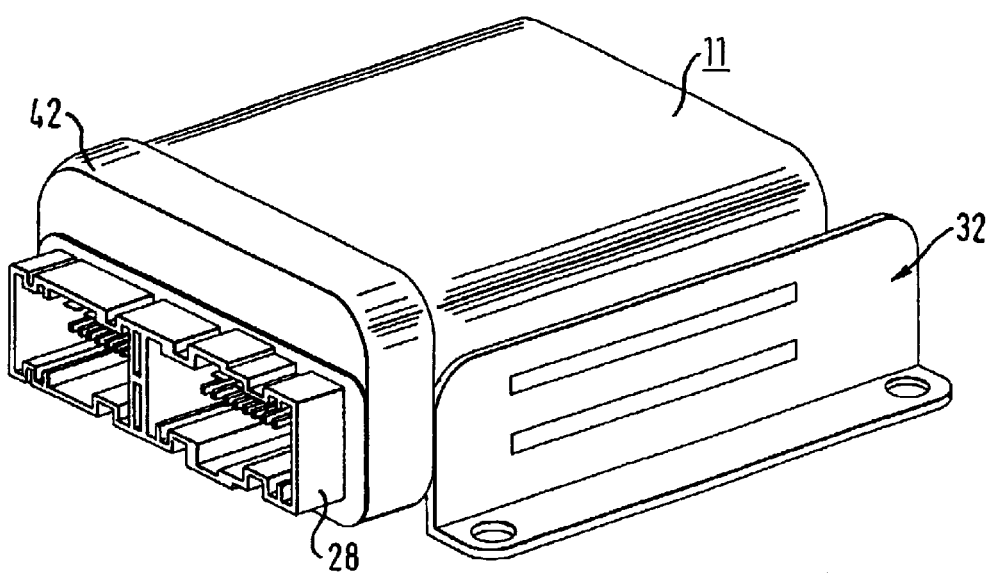
FIG. 4 is a perspective view of a control device with a mounted plug collar and gasket.

The attachment of the housing 10 to the car body via the mounting brackets 32 has the advantage that the same housing can be mounted in installation places with differently shaped fastening points in that, depending on the installation place, mounting brackets with differently shaped openings 40 are attached to the side walls of the housing body 11. Furthermore, the arrangement of the mounting brackets can also be used to vary the length of the control device, as will now be explained with reference to FIGS. 3a and 3b FIG. 3a shows a housing body 11 with two mounting brackets 32 that each have a greater length than the side wall 18 of the housing body 11 to which they are attached, so that the ends 41 of both of them project laterally The plug socket 28 is situated on the side wall of the housing body 11 across from the two laterally projecting ends 41, and said plug socket 28 extends over almost the entire width of the side wall 18 of the housing body 11 In the control device shown in FIG. 3b, the mounting brackets 32 project beyond the side wall 18 of the housing body 11 on which the plug socket 28 is located. As a result, in contrast to the control device shown in FIG. 3a, the plug socket 28 cannot extend essentially over the entire width of the side wall but rather only over the area of the side wall 18 that lies between the laterally projecting ends 41 of the mounting bracket 32 Thanks to the arrangement of the mounting brackets 32 vis-a-vis the plug socket 28 shown in FIG. 3b, a control device length can be obtained that is shorter than that of the arrangement shown in FIG. 3a In order to seal off the plug socket 28 with respect to the housing body 11, the plug socket 28 has a gasket 42 that lies on the outside of the housing, body 11 in the mounted state (also see FIG. 4)

Figure 5:
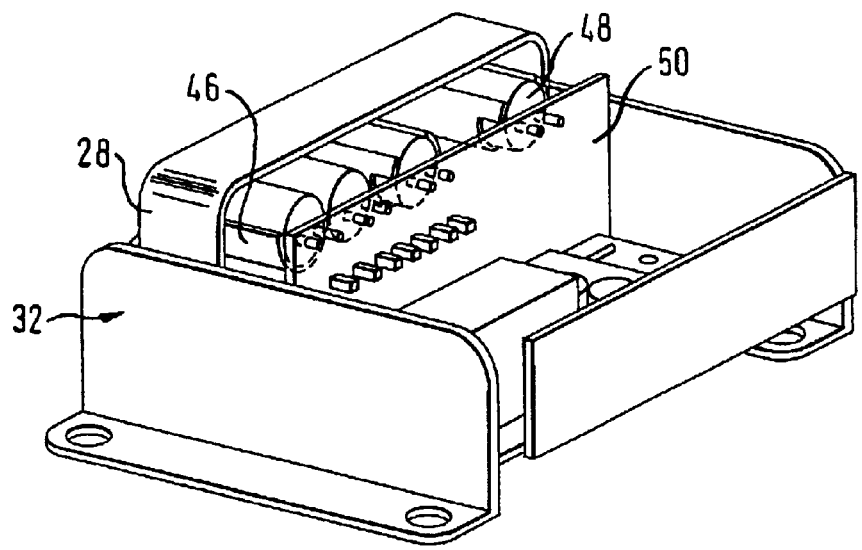
FIG. 5 is a perspective view of a control device according to the invention in another embodiment, with a plug collar whose inside has receptacles for condensers.

According to another embodiment, shown in FIG. 5, the inside area of the plug socket 28 is configured with receptacles 46 to receive capacitors 48. On their end opposite from the plug socket 28, the capacitors 48 are electrically in contact with a printed circuit board 50 The installation of the capacitors 48 in the receptacles 46 in the inside area of the plug collar allows a simple assembly of the capacitors Moreover, this saves space so that smaller dimensions are possible for the housing body 11

Figure 6:
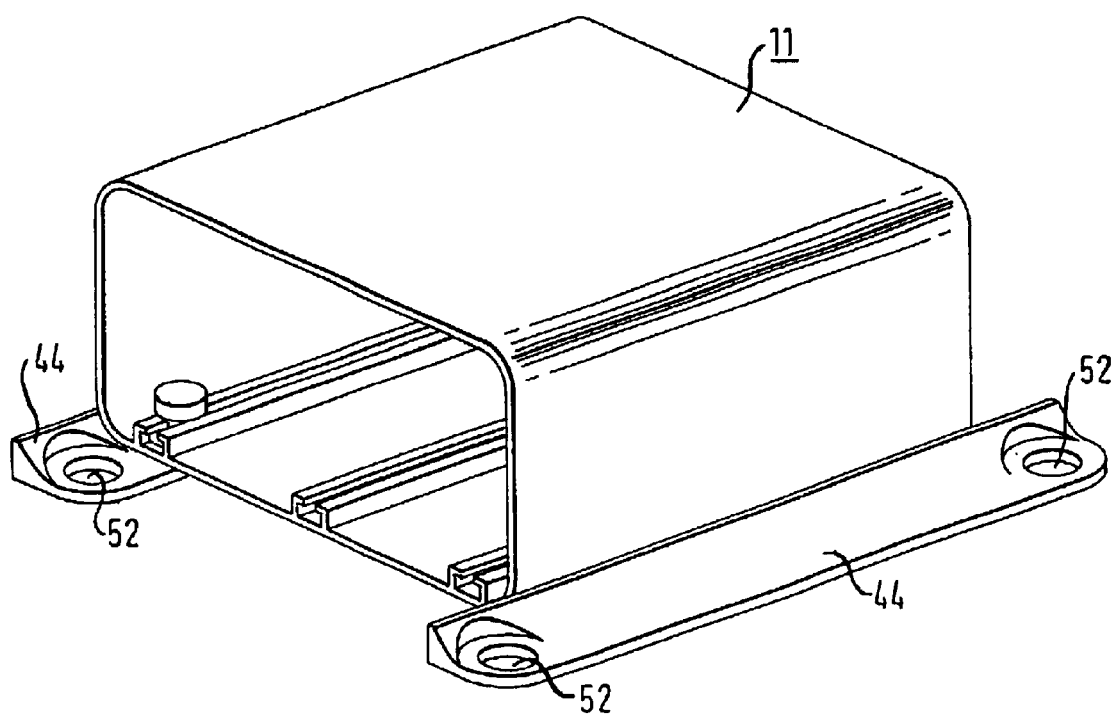
FIG. 6 is a perspective view of another embodiment of a control device according to the invention whose housing has laterally attached profile rails.

Instead of fastening the housing 10 to the car body by means of the mounting brackets 32, according to the invention, as shown in FIG. 6, it is also possible to fasten profile rails 44 with openings 52 to the housing body 11 The profile rails 44 have the advantage over the mounting brackets 32 that they are made of less material and can thus be manufactured less expensively.

Figure 7:
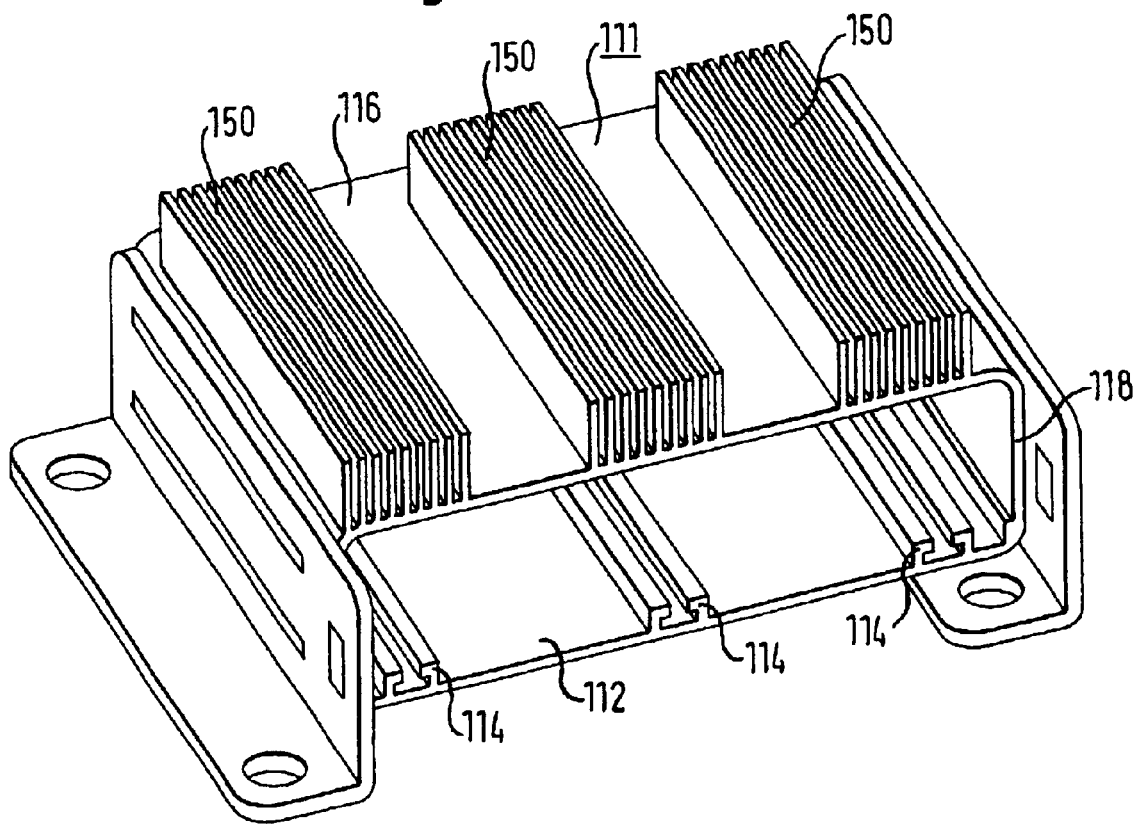
FIG. 7 is a perspective view of a control device according to another embodiment with a housing whose outside has cooling ribs attached to it.

In the electronic control device shown in FIG. 7, the reference numerals corresponding to those of the embodiments shown in FIGS. 1 through 6 are used increased by 100.

The control device shown in FIG. 7 differs from the control devices shown in FIGS. 1 through 6 in that, on the top wall 116 of the housing body 111, cooling ribs 150 are formed. The cooling ribs 150, like the rail-shaped guide elements 114, can be manufactured together with the side walls 118, the top wall 116 and the bottom wall 112 in one piece by means of impact extrusion This housing is preferably suited for accommodating power electronic components since, due to the large cooling surface area of the housing body, the generated heat can be dissipated.

Figure 8:
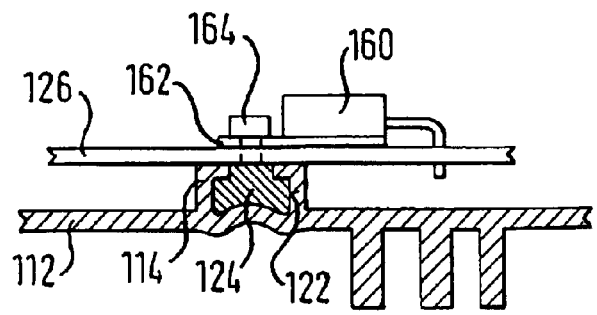
FIG. 8 is a schematic view of a printed circuit board with a power semiconductor that is connected to the housing via a fastening element that has an internal thread and that is arranged in a rail-shaped guide element

An assembly of a printed circuit board 126 with a power semiconductor 160 arranged on it in the housing body 111 is shown in FIG. 8 One end of a fastening member 124, analogously to the embodiment shown in FIG. 2, is connected to a printed circuit board 126 and its other end engages in a form-fitting manner with the internally widened channel 122 of a rail-shaped guide element 114. The bottom wall 112 of the housing body 111 is locally depressed on the outside of the housing body 111 in the area of the fastening member 124 in order to block the fastening member 124 in the channel 122. The fastening member 124 is provided with an internal thread The power semiconductor 160 has a cooling vane 162 to which the power semiconductor is connected by means of a screw 164 inserted into the internal thread of the fastening member 124. In this manner, the heat generated by the power semiconductor can be dissipated via the screw 164 and via the fastening member 124 on the housing body 111 and from there to the environment

What is claimed is:

1. An electronic control device for use in a vehicle, said electronic control device comprising:

a metallic housing; and an electronic component disposed in said metallic housing, said metallic housing having a wall with at least one internal rail, said internal rail forming an elongate channel, said elongate channel having a widened portion and a narrowed portion interposed between said widened portion and said electronic component, said electronic device further comprising at least one fastening member for fastening said electronic component to said metallic housing, said fastening member comprising a stud having a head portion engaged in a form-fitting manner with said widened channel portion and a pin portion extending from said head portion through said narrowed channel portion, said pin portion being attached to said electronic component by pressing said pin portion into an opening in said electronic component, said head portion and said pin portion of said fastening member both being non-threaded.

2. The device of claim 1, wherein said channel has an open end into which said head portion of said fastening member is inserted.

3. The device of claim 1, wherein said housing wall is embossed from outside of said housing to block said fastening member in said rail.

4. The device of claim 1, wherein said one electronic component comprises a printed circuit board and said pin portion of said fastening member is attached to said printed circuit board.

5. The device of claim 4, wherein said fastening member is metallic and electrically connects said housing wall with circuitry on said printed circuit board.

6. The device of claim 1, wherein said housing wall is a bottom wall.

7. The device of claim 6, wherein said elongate channel extends all across said bottom wall.

8. The device of claim 1, wherein said housing has a generally tubular body with parallel top, bottom and side walls integrally shaped by impact extrusion, said rail being integrally shaped with said housing wall.

9. The device of claim 8, wherein said housing is integrally shaped with external cooling ribs.

10. An electronic control device for use in a vehicle, comprising a metallic housing for accommodating a printed circuit board of the control device, said housing having a wall with at least one internal rail, said internal rail forming an elongate channel which widens internally of said rail, said device further comprising at least one fastening member, said fastening member being a stud having a head portion which can be engaged in a form-fitting manner with said internally widened channel and having a pin portion which is connected to said printed circuit board, said printed circuit board accommodating a power semiconductor thermally connected to said housing wall by means of said fastening member.

11. An electronic control device for use in a vehicle, said electronic control device comprising a metallic housing for accommodation of electronic components of said control device, said metallic housing having a wall with at least one internal rail, said internal rail forming an elongate channel which widens internally of said rail, said electronic control device further comprising at least one non-threaded fastening member, said fastening member having a head portion inserted and retained in said elongate channel and having a pin portion connected to one of said electronic components by pressing said pin portion into an opening in said one of said electronic components, said housing wall being embossed from outside of said housing to prevent movement of said fastening member along said rail.

12. An electronic control device for use in a vehicle, comprising a metallic housing for accommodation of electronic components of the control device, said housing having a wall with at least one internal rail, said internal rail forming an elongate channel which widens internally of said rail, and further comprising at least one fastening member, said fastening member having a head portion inserted and retained in said channel and having a pin portion connected to one of said electronic components, said housing having a pair of parallel side walls and mounting brackets which are externally attached to said side walls, at least one of said mounting brackets having a length which is greater than that of said corresponding side wall and a bottom web, said bottom web extending over the whole length of the mounting bracket and extending under said housing wall and having an end which projects laterally from said housing wall.

13. The device of claim 12, wherein said mounting brackets are attached to said side walls by means of complementary and inter-engaged rib and slit structures.

14. An electronic control device for use in a vehicle, comprising a metallic housing for accommodating of electronic components of the control device, said housing having a wall with at least one internal rail, said internal rail forming an elongate channel which widens internally of said rail, and further comprising at least one fastening member, said fastening member having a head portion inserted and retained in said channel and having a pin portion connected to one of said electronic components, said one electronic component comprising a printed circuit board, said printed circuit board accommodating a power semiconductor device having a cooling vane, said cooling vane being connected to said housing by means of said fastening member, the heat being generated by the power semiconductor being thereby dissipated by said fastening member to said metallic housing.

\* \* \* \* \*